(12) United States Patent
Wei et al.

(10) Patent No.: US 11,942,134 B2
(45) Date of Patent: *Mar. 26, 2024

(54) MEMORY CIRCUIT AND WRITE METHOD

(71) Applicant: TAIWAN SEMICONDUCTOR MANUFACTURING COMPANY, LTD., Hsinchu (TW)

(72) Inventors: Huan-Sheng Wei, Hsinchu (TW); Tzer-Min Shen, Hsinchu (TW); Zhiqiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/056,807

(22) Filed: Nov. 18, 2022

(65) Prior Publication Data

US 2023/0083548 A1 Mar. 16, 2023

Related U.S. Application Data

(63) Continuation of application No. 17/198,790, filed on Mar. 11, 2021, now Pat. No. 11,508,427.

(60) Provisional application No. 63/031,204, filed on May 28, 2020.

(51) Int. Cl.
*G11C 11/22* (2006.01)
*H10B 51/30* (2023.01)
*H10B 51/40* (2023.01)

(52) U.S. Cl.
CPC ........ *G11C 11/2275* (2013.01); *G11C 11/223* (2013.01); *G11C 11/2273* (2013.01); *H10B 51/30* (2023.02); *H10B 51/40* (2023.02)

(58) Field of Classification Search
None
See application file for complete search history.

(56) References Cited

U.S. PATENT DOCUMENTS

| 5,623,439 A | 4/1997 | Gotoh et al. |
| 6,537,830 B1 | 3/2003 | Arita et al. |
| 11,508,427 B2 * | 11/2022 | Wei ........................ H10B 51/30 |
| 2004/0061153 A1 | 4/2004 | Misewich et al. |

(Continued)

FOREIGN PATENT DOCUMENTS

KR  20060050260  5/2006

OTHER PUBLICATIONS

Office Action dated May 20, 2022 for corresponding case No. KR 10-2021-0059961. (pp. 1-5).

*Primary Examiner* — Tan T. Nguyen
(74) *Attorney, Agent, or Firm* — Hauptman Ham, LLP (57) ABSTRACT

A memory circuit includes a memory array including a plurality of memory cells, each memory cell of the plurality of memory cells including an n-type channel layer including a metal oxide material, and a gate structure overlying and adjacent to the n-type channel layer, the gate structure including a conductive layer overlying a ferroelectric layer. The memory circuit is configured to apply a gate voltage to each memory cell of the plurality of memory cells in first and second write operations, the gate voltage has a positive polarity and a first magnitude in the first write operation and a negative polarity and a second magnitude greater than the first magnitude in the second write operation.

20 Claims, 6 Drawing Sheets

(56) References Cited

U.S. PATENT DOCUMENTS

| | | |
|---|---|---|
| 2005/0059172 A1 | 3/2005 | Kim |
| 2006/0056225 A1 | 3/2006 | Hashimoto et al. |
| 2006/0081901 A1 | 4/2006 | Arimoto et al. |
| 2018/0286987 A1 | 10/2018 | Lee et al. |
| 2019/0181147 A1 | 6/2019 | Liu et al. |
| 2019/0288116 A1* | 9/2019 | Yoo .................... H01L 29/1608 |
| 2019/0393355 A1 | 12/2019 | Yoo et al. |
| 2020/0202916 A1 | 6/2020 | Lee et al. |
| 2021/0175253 A1 | 6/2021 | Han et al. |
| 2021/0272972 A1 | 9/2021 | Young et al. |

* cited by examiner

| 410 | Use a sense amplifier to perform a first read operation based on a threshold voltage of a memory cell |

| 420 | Perform a first write operation on the memory cell by applying a gate voltage to a ferroelectric layer of a gate structure and a ground voltage level to a channel layer comprising indium gallium zinc oxide (IGZO), the gate voltage having a positive polarity and a first magnitude |

| 430 | Perform a second write operation on the memory cell by applying the gate voltage to the ferroelectric layer and the ground voltage level to the channel layer, the gate voltage having a negative polarity and a second magnitude greater than the first magnitude |

| 440 | Use the sense amplifier to perform a second read operation based on the threshold voltage of the memory cell |

FIG. 4

MEMORY CIRCUIT AND WRITE METHOD

PRIORITY CLAIM

The present application is a continuation of U.S. application Ser. No. 17/198,790, filed May 28, 2020, now U.S. Pat. No. 11,508,427, issued on Nov. 22, 2022, which claims the priority of U.S. Provisional Application No. 63/031,204, filed Mar. 11, 2021, each of which is incorporated herein by reference in its entirety.

BACKGROUND

In some applications, integrated circuits (ICs) include memory circuits that store data in non-volatile memory (NVM) in which data are not lost when the IC is powered off. Types of NVM cells include three-terminal devices, in which a dielectric layer between a gate and each of two source/drain (S/D) terminals has one or more properties capable of being altered in response to applied voltages such that detectable property variations are used to represent stored logical states. In some cases, the dielectric layer includes a ferroelectric material and the device is referred to as a ferroelectric random-access memory (FRAM or FeRAM) cell. In some cases, a conductive channel of an NVM cell includes a high electron mobility material, e.g., a metal oxide such as indium gallium zinc oxide (IGZO).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit and write method include asymmetrically programming a FeRAM cell including a metal oxide channel by using a first write operation in which a gate voltage has a positive polarity and a first magnitude, and a second write operation in which the gate voltage has a negative polarity and a second magnitude greater than the first magnitude. Compared to symmetrical approaches in which FeRAM cells including metal oxide channels are programmed using gate voltages having opposite polarities and equal magnitudes, the memory circuit and write method are capable of achieving higher threshold voltages and increased memory windows based on threshold voltage differences. The memory circuit and write method thereby enable gate electrode work function adjustments of less than 0.5 electron-volts (eV) compared to approximately 1 eV used in some approaches in which FeRAM cells including metal oxide channels are programmed using gate voltages having opposite polarities and equal magnitudes.

Figure 1A:
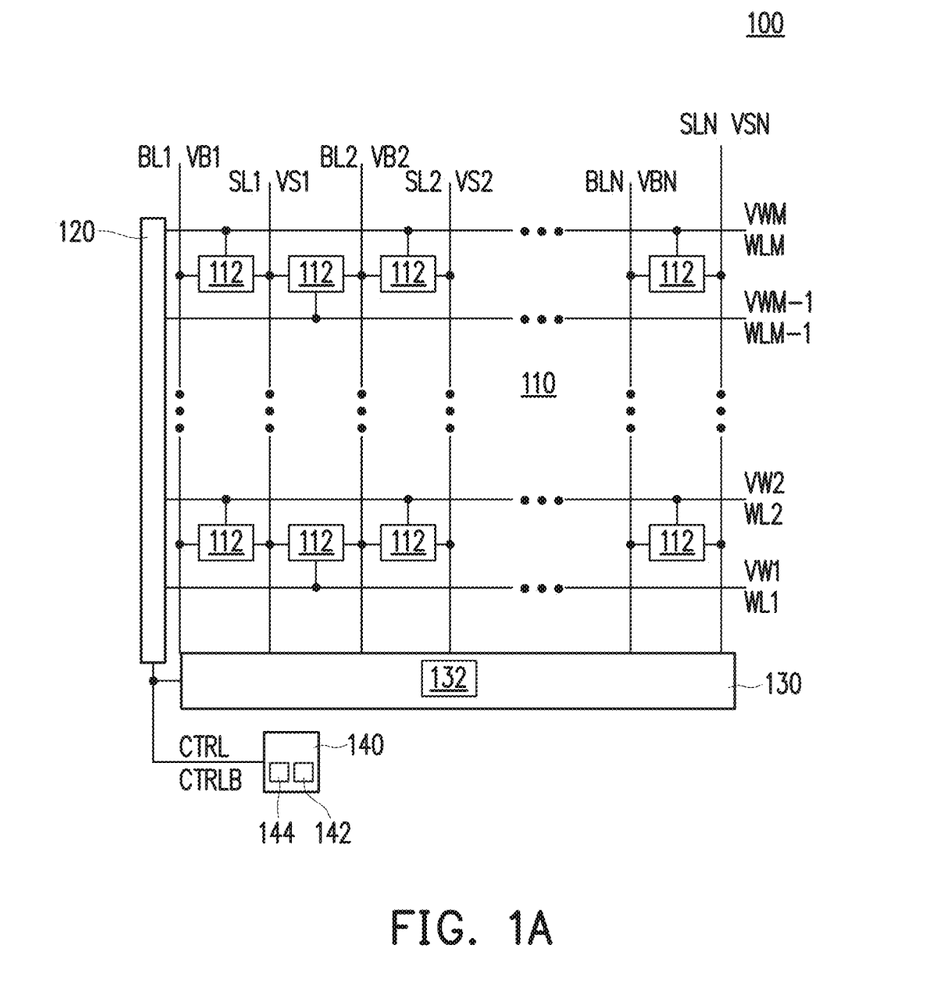
FIG. 1A is a diagram of a memory circuit, in accordance with some embodiments.
Figure 1B:
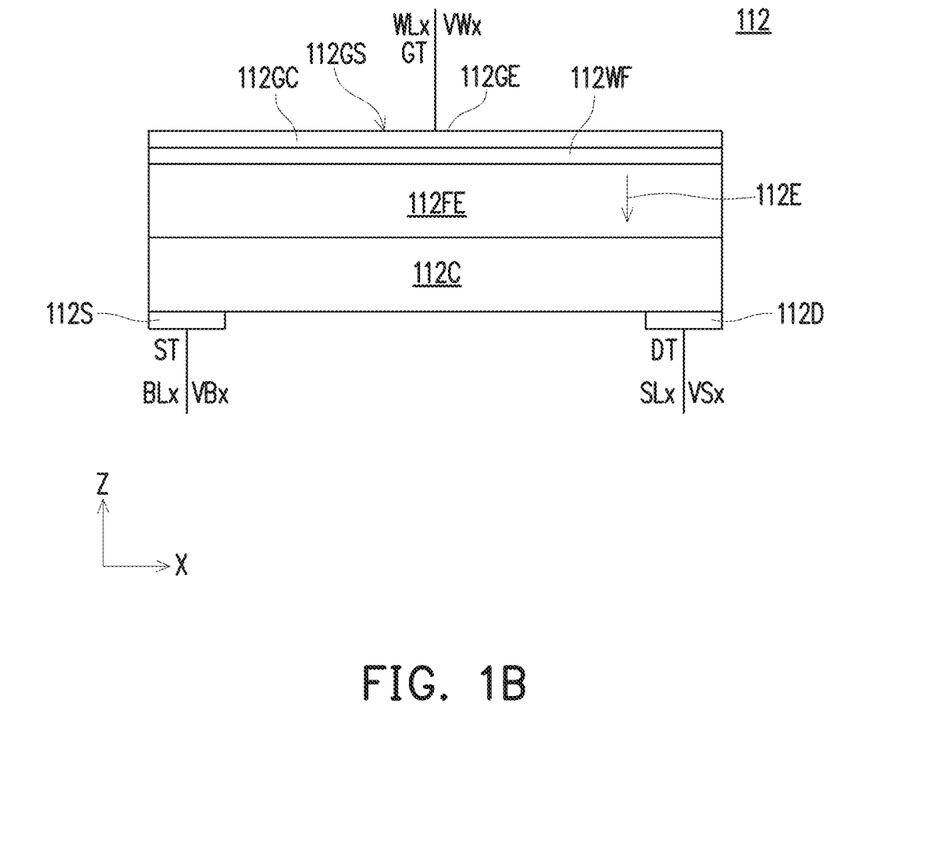
FIG. 1B is a diagram of a memory cell, in accordance with some embodiments.

FIG. 1A is a diagram of a memory circuit 100, in accordance with some embodiments, and FIG. 1B is a diagram of a memory cell 112, in accordance with some embodiments. Each of memory circuit 100 and memory cell 112 is simplified for the purpose of illustration. In various embodiments, one or both of memory circuit 100 or memory cell 112 includes various elements in addition to those depicted in FIGS. 1A and 1B or is otherwise arranged so as to be capable of performing the operations discussed below. FIG. 1B depicts a cross-section of memory cell 112 and includes the X and Z directions.

Memory circuit 100 includes a memory array 110 coupled to a word line driver 120 and a read/write (R/W) interface 130, and a control circuit 140 coupled to word line driver 120 and R/W interface 130 through a control signal bus CTRLB. Memory circuit 100 is configured to be capable of executing some or all of a method, e.g., a method 400 discussed below with respect to FIG. 4, in which data are written to one or more instances of memory cell 112, as discussed below.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

Memory array 110 includes memory cells 112 arranged in columns and rows (not labeled), and each memory cell 112 is coupled to one of word lines WL1-WLM (designated as WLx in FIG. 1B), one of bit lines BL1-BLN (designated as BLx in FIG. 1B), and one of select lines SL1-SLN (designated as SLx in FIG. 1B). In some embodiments, memory array 110 includes the number of rows ranging from 64 to 1024. In come embodiments, memory array 110 includes the number of rows ranging from 128 to 512. In some embodiments, memory array 110 includes the number of columns ranging from eight to 256. In come embodiments, memory array 110 includes the number of columns ranging from 36 to 96.

In the embodiment depicted in FIG. 1A, memory array 110 includes the rows and columns arranged along respective row and column dimensions (not labeled). In some embodiments, memory array 110 has a three-dimensional (3D) arrangement, also referred to as a stacked arrangement, that includes one or more array layers (not shown) arranged perpendicularly to the row and column dimensions of the single layer depicted in FIG. 1A such that memory array 110 includes rows and columns in addition to those depicted in FIG. 1A.

As depicted in FIGS. 1A and 1B, memory cell 112 is a three-terminal device including a gate terminal GT coupled to one of word lines WL1-WLM (WLx), a source terminal ST coupled to one of bit lines BL1-BLN (BLx), and a drain terminal DT coupled to one of select lines SL1-SLN (SLx). The arrangement of memory cells 112, word lines WL1-WLM, bit lines BL1-BLN, and select lines SL1-SLN depicted in FIGS. 1A and 1B is a non-limiting example provided for the purpose of illustration. In various embodiments, memory array 110 includes arrangements other than that depicted in FIGS. 1A and 1B, e.g., source terminals ST coupled to select lines SL1-SLN and drain terminals DT coupled to bit lines BL1-BLN, and is thereby capable of realizing the benefits discussed below.

Memory cell 112 includes a gate structure 112GS coupled to gate terminal GT, a source contact 112S coupled to source terminal ST and a drain contact 112D coupled to drain terminal DT. A channel layer 112C extends in the X direction between source contact 112S and drain contact 112D, and above and adjacent to each of source contact 112S and drain contact 112D, and is positioned below and adjacent to gate structure 112GS. The arrangement and spatial relationships depicted in FIG. 1B are non-limiting examples provided for the purpose of illustration. In various embodiments, memory cell 112 includes arrangements and/or spatial relationships other than those depicted FIG. 1B, and is thereby capable of realizing the benefits discussed below.

Gate structure 112GS includes a gate electrode 112GE, including conductive layers 112GC and 112WF, coupled to gate terminal GT, and a ferroelectric layer 112FE adjacent to gate electrode 112GE. In some embodiments, gate structure 112GS includes one or more dielectric layers (not shown) including one or more dielectric materials, e.g., $SiO_2$ and/or one or more high-k dielectric materials, between gate electrode 112GE and ferroelectric layer 112FE and/or between ferroelectric layer 112FE and channel layer 112C.

Conductive layer 112GC includes one or more conductive materials and is thereby configured to, in operation, receive a voltage VWx (one of voltages VW1-VWM depicted in FIG. 1A) from gate terminal GT, and store and distribute a corresponding charge capable of establishing, in part, an electric field 112E across ferroelectric layer 112FE. In various embodiments, conductive materials include polycrystalline silicon (poly), aluminum (Al), tungsten (W), copper (Cu), cobalt (Co), and/or other suitable materials.

In some embodiments, conductive layer 112WF includes one or more n-type work function materials and is thereby configured to increase a work function of the gate electrode by a target value compared to a work function of an equivalent gate electrode that does not include conductive layer 112WF. In various embodiments, n-type work function materials include one or more of Ti, Ag, TaAl, TaAlC, TiAlN, TaC, TaCN, TaSiN, Mn, Zr, or other suitable n-type work function materials.

In some embodiments, conductive layer 112WF is configured to increase the gate electrode work function by the target value less than 0.5 eV. In some embodiments, conductive layer 112WF is configured to increase the gate electrode work function by the target value ranging from 0.1 eV to 0.2 eV. In some embodiments, gate structure 100GS does not include conductive layer 112WF, and gate electrode 112GE is equivalent to conductive layer 112GC.

Ferroelectric layer 112FE includes one or more ferroelectric materials and is thereby configured to include electric dipoles having orientations controllable responsive to electric field 112E, the dipole orientations being usable to store logic high and logic low levels, as discussed below. In various embodiments, the one or more ferroelectric materials include lead zirconate titanate (PZT), hafnium oxide ($HfO_2$), hafnium zirconium oxide (HZO), or other suitable ferroelectric materials.

Channel layer 112C includes an n-type semiconducting metal oxide material such as IGZO, zinc oxide, or another suitable high electron mobility material. Each of source contact 112S and drain contact 112D is positioned below and adjacent to channel layer 112C and includes one or more conductive materials.

In some embodiments, memory cell 112 is positioned in an interconnect structure of a semiconductor device, e.g., a back end of line (BEOL) structure, and one or more of conductive layer 112GC, source contact 112S, or drain contact 112D includes one or more conductive segments corresponding to the interconnect structure.

Source contact 112S is thereby configured to, in operation, receive a voltage VBx (one of voltages VB1-VBN depicted in FIG. 1A) from source terminal ST, and drain contact 112D is thereby configured to receive a voltage VSx (one of voltages VS1-VSN depicted in FIG. 1A) from drain terminal DT. Source contact 112S and drain contact 112D are thereby configured to, responsive to voltages VBx and VSx, bias channel 112C so as to establish, in part, electric field 112E.

By the configuration discussed above, memory cell 112 is capable of establishing electric field 112E in ferroelectric layer 112FE having the orientation depicted in FIG. 1B responsive to voltage VWx received at gate terminal GT, voltage VBx received at source terminal ST, and voltage VSx received at drain terminal DT. Memory cell 112 is thereby configured to be further capable of operating as a transistor having threshold voltage levels representing stored logic levels based on first and second write operations, as discussed below.

In the first write operation, voltage VWx having a positive polarity and each of voltages VBx and VSx having a ground voltage level establish electric field 112E so as to cause the electric dipoles in ferroelectric layer 112FE to have a first orientation including negative charges concentrated near gate electrode 112GE and positive charges concentrated near channel 112C.

In the second write operation, voltage VWx having a negative polarity and each of voltages VBx and VSx having the ground voltage level establish electric field 112E so as to cause the electric diploes in ferroelectric layer 112FE to have a second orientation including positive charges concentrated near gate electrode 112GE and negative charges concentrated near channel 112C.

Each of the first and second dipole orientations is retained following the corresponding write operation such that, in subsequent transistor operations, electric field 112E having the orientation depicted in FIG. 1B is aided by the positive charge concentration of the first dipole orientation and opposed by the negative charge concentration of the second dipole orientation. In transistor operation, a threshold voltage of memory cell 112 is thereby decreased by the first write operation and increased by the second write operation such that the different threshold voltages correspond to stored logic levels, as discussed below with respect to FIGS. 3A and 3B.

In some embodiments, the first write operation corresponds to programming memory cell 112 to a logic low, or "0" level, and the second write operation corresponds to programming memory cell 112 to a logic high, or "1" level.

Figure 2A:
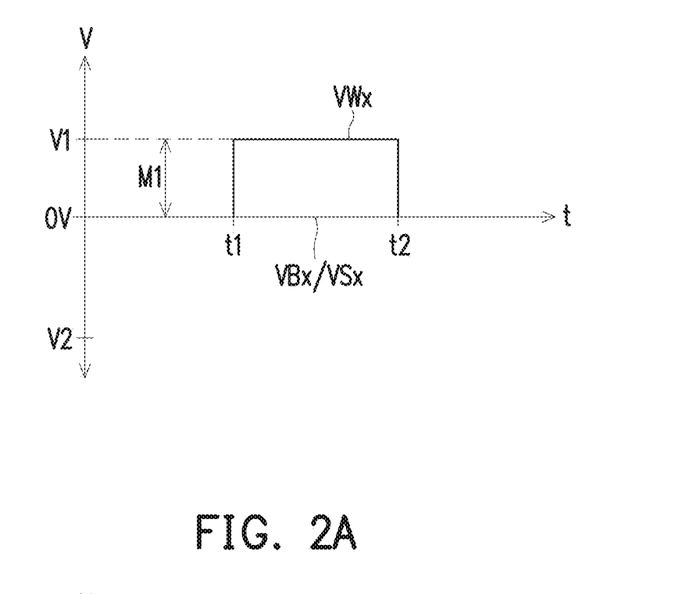
FIGS. 2A and 2B depict memory circuit operating parameters, in accordance with some embodiments.
Figure 2B:
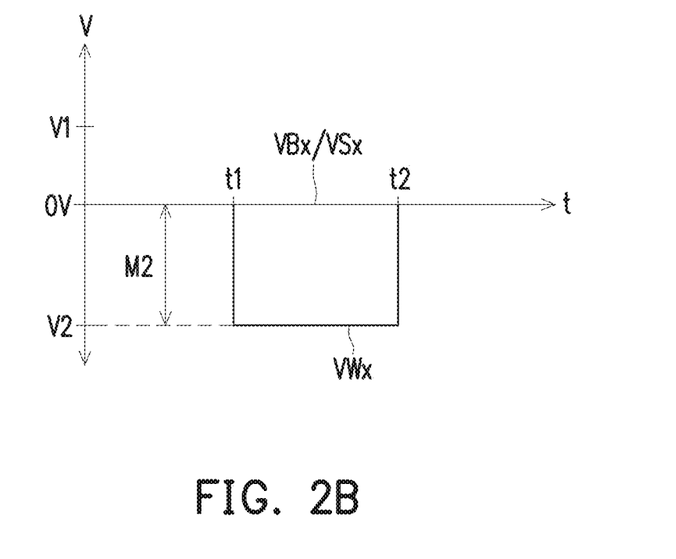

FIGS. 2A and 2B depict memory circuit 100 operating parameters, in accordance with some embodiments. FIG. 2A is a non-limiting example of a first write operation, and FIG. 2B is a non-limiting example of a second write operation. In some embodiments, the first and second write operations are collectively referred to as asymmetric write operations. Each of FIGS. 2A and 2B includes time plotted on the x-axis and voltage plotted on the y-axis.

In the first write operation example depicted in FIG. 2A, control circuit 140 is configured as discussed below to control voltage VWx to have voltage level V1 and each of voltages VBx and VSx to have a voltage level of 0 volts (V), also referred to as a ground voltage level in some embodiments, between a time t1 and a time t2. In the second write operation example depicted in FIG. 2B, control circuit 140 controls voltage VWx to have a voltage level V2 and each of voltages VBx and VSx to have the voltage level of 0 V between time t1 and time t2. Voltage level V1 has a positive polarity and a first magnitude M1, and voltage level V2 has a negative polarity and a second magnitude M2 greater than first magnitude M1.

In some embodiments, first magnitude M1 has a value less than 3 V, e.g., a value ranging from 1.5 V to 3 V. In some embodiments, first magnitude M1 has a value ranging from 2 V to 2.5 V. Decreasing values of first magnitude M1 correspond to decreasing threshold voltages of memory cell 112 and thereby to increasing memory windows, as discussed above and further discussed below with respect to FIGS. 3A and 3B, this effect being limited by the intrinsic characteristics of ferroelectric layer 112FE.

In some embodiments, second magnitude M2 has a value greater than 3 V, e.g., a value ranging from 3 V to 5.5 V. In some embodiments, second magnitude M2 has a value ranging from 3.5 V to 5 V. Increasing values of second magnitude M2 correspond to increasing threshold voltages of memory cell 112 and thereby to increasing memory windows, as discussed above and further discussed below with respect to FIGS. 3A and 3B, this effect also being limited by the intrinsic characteristics of ferroelectric layer 112FE.

In some embodiments, first magnitude M1 has a value equal to approximately one half a value of second magnitude M2.

Figure 3A:
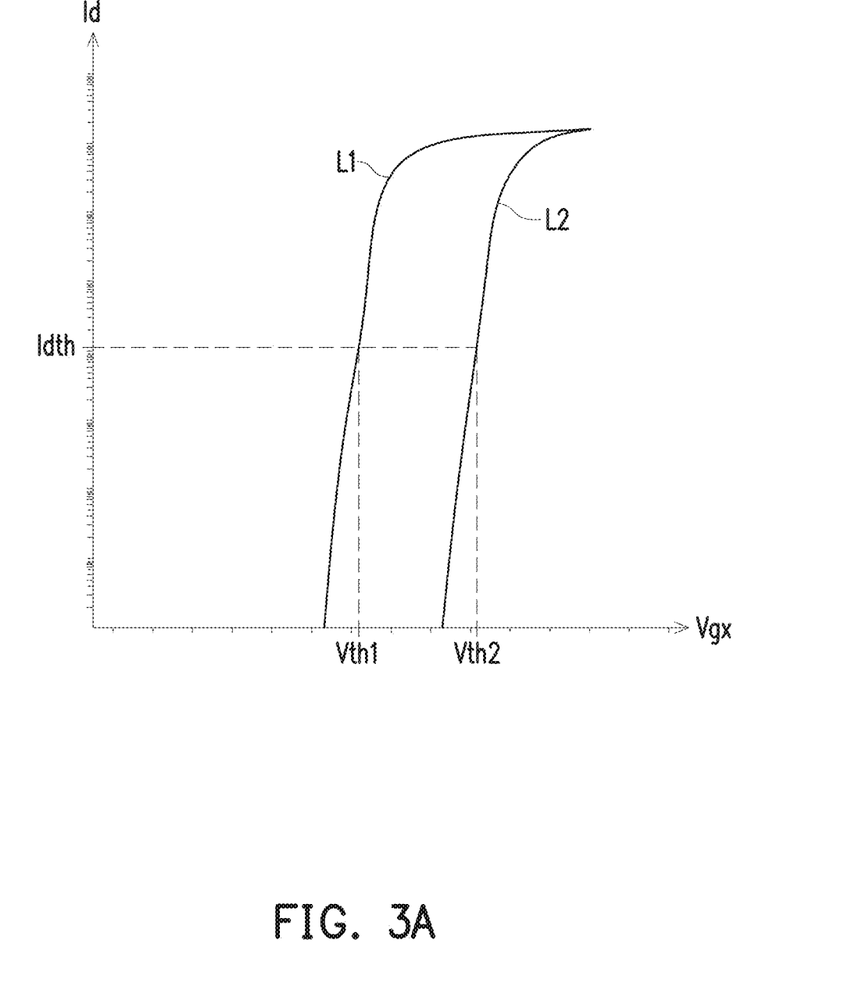
FIGS. 3A and 3B depict memory cell operating parameters, in accordance with some embodiments.
Figure 3B:
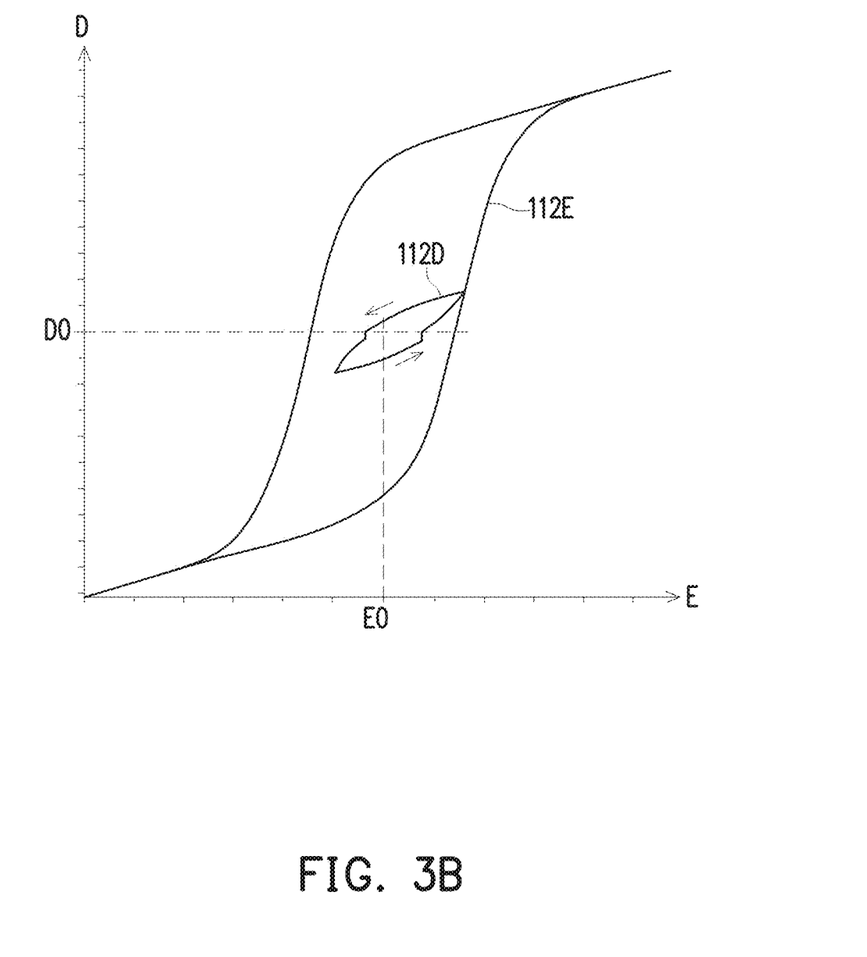

By being configured to perform the first write operation in which gate voltage Vgx has the positive polarity and first magnitude M1, and the second write operation in which gate voltage VGx has the negative polarity and second magnitude M2, memory circuit 100 is capable of achieving higher threshold voltages and increased memory windows based on threshold voltage differences compared to approaches in which FeRAM cells including high electron mobility channel materials are programmed using gate voltages having opposite polarities and equal magnitudes, as further discussed below with respect to FIGS. 3A and 3B.

In various embodiments, in one or both of the first write operation depicted in FIG. 2A or the second write operation depicted in FIG. 2B, one or more of voltages VWx, VBx, or VSx has the voltage level 0V prior to time t1 and/or subsequent to time t2. In various embodiments, in one or both of the first write operation depicted in FIG. 2A or the second write operation depicted in FIG. 2B, one or more of gate terminal GT, source terminal ST, or drain terminal DT is floating such that the corresponding voltage VWx, VBx, or VSx is undefined prior to time t1 and/or subsequent to time t2.

In the embodiment depicted in FIGS. 2A and 2B, each of the first and second write operations has a same duration from time t1 to time t2 during which voltage VWx has the corresponding one of voltage levels V1 or V2 and each of voltages VBx and VSx has the voltage level of 0 V. In various embodiments, the first write operation has a duration greater or lesser than a duration of the second write operation. In some embodiments, the duration of the first write operation increases with increasing values of the first magnitude M1 and/or the duration of the second write operation increases with increasing values of the second magnitude M2. In some embodiments, the duration of the first write operation increases with decreasing values of the first magnitude M1 and/or the duration of the second write operation increases with decreasing values of the second magnitude M2.

FIGS. 3A and 3B depict memory cell 112 operating parameters, in accordance with some embodiments. FIG. 3A is a non-limiting example of a relationship between memory cell 112 programmed logic levels and threshold voltages, and FIG. 3B is a non-limiting example of a relationship between electric field 112E and a resultant gate charge density 112D of ferroelectric layer 112FE.

FIG. 3A depicts gate voltage Vgx plotted on the x-axis and a channel current Id plotted logarithmically on the y-axis. A curve L1 corresponds to memory cell 112 programmed to the logic low level as a result of the first write operation, and a curve L2 corresponds to memory cell 112 programmed to the logic high level as a result of the second write operation.

Each of curves L1 and L2 depicts a relationship between gate voltage Vgx and channel current Id based on a voltage difference between voltage VBx received at source terminal ST and voltage VSx received at drain terminal DT2. In some embodiments, the voltage difference is referred to as a drain-source voltage. In some embodiments, the voltage difference has a value ranging from 25 millivolts (mV) to 100 mV. In some embodiments, the voltage difference has a value ranging from 40 mV to 60 mV.

A current level Idth delineates a first region in which memory cell 112 is considered to be switched off based on values of channel current Id below current level Idth and a second region in which memory cell 112 is considered to be switched on based on values of channel current Id at or above current value Idth, current level Idth thereby corresponding to threshold voltages of memory cell 112. In some embodiments, current level Idth has a value ranging from 1 nanoampere (nA) to 1 microampere (µA). In some embodiments, current level Idth has a value ranging from 10 nA to 100 nA.

The point along curve L1 at which current Id has current level Idth corresponds to a threshold voltage level Vth1, and the point along curve L2 at which current Id has current level Idth corresponds to a threshold voltage level Vth2. Threshold voltage level Vth1 is thereby based on memory cell 112 being programmed to the logic low level as the result of the first write operation, and threshold voltage level Vth2 is thereby based on memory cell 112 being programmed to the logic high level as the result of the second write operation. As depicted in FIG. 3A, threshold voltage level Vth1 is less than threshold voltage level Vth2.

The programmed state of memory cell 112 is thereby detectable based on the difference between threshold voltage levels Vth1 and Vth2, referred to as a memory window in some embodiments. In some embodiments, threshold voltage level Vth1 is less than threshold voltage level Vth2 by an amount greater than 0.3 V. In some embodiments, threshold voltage level Vth1 is less than threshold voltage level Vth2 by an amount greater than 0.5 V, e.g., an amount ranging from 0.5 V to 1 V. In some embodiments, threshold voltage level Vth1 is less than threshold voltage level Vth2 by an amount ranging from 0.7 V to 0.9 V.

The difference between threshold voltage levels Vth1 and Vth2 based on the first and second write operations of memory circuit 100 is greater than voltage threshold level differences in approaches in which FeRAM cells including high electron mobility channel materials are programmed using gate voltages having opposite polarities and equal magnitudes, e.g., approaches in which threshold voltage level differences are less than 0.5 V, e.g., 0.3 V or less. In read operations, the greater threshold voltage level differences thereby allow memory circuit 100 to determine a programmed logic level of memory cell 112 more reliably compared to such approaches.

FIG. 3B depicts electric field values E plotted on the x-axis and charge density values D plotted on the y-axis. A zero electric field value E0 separates negative electric field values E on the left from positive electric field values E on the right, and a zero charge density value D0 separates negative charge density values D below from positive charge density values D above.

Electric field 112E ranges from a lowest negative electric field value E to a highest positive electric field value E, and gate charge density 112D ranges from a lowest negative charge density value D to a highest positive charge density value D (none labeled). Each of electric field 112E and gate charge density 112D exhibits a hysteresis effect based on changes in dipole orientations corresponding to forward biasing indicated by the right-pointing arrow and reverse biasing indicated by the left-pointing arrow.

Based on the first and second write operations of memory circuit 100, charge density values of gate charge density 112D include a greater proportion of negative charge density values D compared to approaches in which FeRAM cells including high electron mobility channel materials are programmed using gate voltages having opposite polarities and equal magnitudes. Accordingly, memory circuit 100 is capable of including memory cells 112 having gate electrode work function adjustments of less than 0.5 eV, e.g., 0.1 eV to 0.2 eV, as discussed above, compared to such other approaches in which work function adjustments greater than 0.5 eV, e.g., approximately 1 eV, are used.

As depicted in FIG. 1A, word line driver 120 is an electronic circuit configured to generate word line voltages VW1-VWM on respective word lines WL1-WLM based on one or more of control signals CTRL received from control circuit 140 on control signal bus CTRLB or from one or more circuits (not shown) external to memory circuit 100. Word line driver 120 is configured to drive each of word line voltages VW1-VWM (depicted in FIGS. 1B-3A as VWx) to voltage level V1 in the first write operation, voltage level V2 in the second write operation, and one or more voltage levels, e.g., a threshold and/or ground voltage level, appropriate for performing read and/or other operations on a given memory cell 112.

R/W interface 130 is an electronic circuit configured to generate select line voltages VS1-VSN on respective select lines SL1-SLN and bit line voltages VB1-VBN on respective bit lines BL1-BLN based on one or more of control signals CTRL received from control circuit 140 on control signal bus CTRLB or from one or more circuits (not shown) external to memory circuit 100. R/W interface 130 is configured to drive each of select line voltages VS1-VSN (depicted in FIGS. 1B-3A as VSx) and each of bit line voltages VB1-VBN (depicted in FIGS. 1B-3A as VBx) in the manner discussed above with respect to word line voltages VW0-VW5, to the ground voltage level 0V in the first and second write operations and one or more voltage levels appropriate for performing read and/or other operations on a given memory cell 112.

R/W interface 130 includes one or more sense amplifiers 132 and is thereby configured to perform one or more read operations, e.g., measure one or more currents, voltages, or voltage differences, based on one or more signals received on one or a combination of select lines SL1-SLN or bit lines BL1-BLN, in which a programmed logic high or logic low level of a selected memory cell 112 is detected.

In some embodiments, the one or more sense amplifiers 132 are configured to determine a programmed state of a selected memory cell 112 based on a first threshold voltage level, e.g., threshold voltage level Vth1, being less than a second threshold voltage level, e.g., threshold voltage level Vth2, by at least 0.5 volts. In some embodiments, the one or more sense amplifiers 132 are configured to determine the programmed state of the selected memory cell 112 based on one or more currents, e.g., channel current Id, corresponding to one or more values of word line voltage VWx, e.g., threshold voltage levels Vth1 or Vth2 and/or a value of word line voltage VWx between threshold voltage levels Vth1 and Vth2.

Control circuit 140 is an electronic circuit configured to control operation of memory circuit 100 by generating the one or more control signals CTRL on control signal bus CTRLB and received by word line driver 120 and R/W interface 130 in accordance with the embodiments discussed below. In various embodiments, control circuit 140 includes a hardware processor 142 and a non-transitory, computer-readable storage medium 144. Storage medium 144, amongst other things, is encoded with, i.e., stores, computer program code, i.e., a set of executable instructions. Execution of the instructions by hardware processor 142 represents (at least in part) a memory circuit operation tool which implements a portion or all of, e.g., method 400 discussed below with respect to FIG. 4 (hereinafter, the noted processes and/or methods).

Processor 142 is electrically coupled to computer-readable storage medium 144, an I/O interface, and a network via a bus (details not shown). The network interface is connected to a network (not shown) so that processor 142 and computer-readable storage medium 144 are capable of connecting to external elements via the network. Processor 142 is configured to execute the computer program code encoded in computer-readable storage medium 144 in order to cause control circuit 140 and memory circuit 100 to be usable for performing a portion or all of the noted processes and/or methods. In one or more embodiments, processor 142 is a central processing unit (CPU), a multi-processor, a distributed processing system, an application specific integrated circuit (ASIC), and/or a suitable processing unit.

In one or more embodiments, computer-readable storage medium 144 is an electronic, magnetic, optical, electromagnetic, infrared, and/or a semiconductor system (or apparatus or device). For example, computer-readable storage medium 144 includes a semiconductor or solid-state memory, a magnetic tape, a removable computer diskette, a random access memory (RAM), a static RAM (SRAM), a dynamic RAM (DRAM), a read-only memory (ROM), a rigid magnetic disk, and/or an optical disk. In one or more embodiments using optical disks, computer-readable storage medium 144 includes a compact disk-read only memory (CD-ROM), a compact disk-read/write (CD-R/W), and/or a digital video disc (DVD).

In one or more embodiments, storage medium 144 stores the computer program code configured to cause control circuit 140 to generate the control signals so as to be usable for performing a portion or all of the noted processes and/or methods. In one or more embodiments, storage medium 144 also stores information which facilitates performing a portion or all of the noted processes and/or methods. In one or more embodiments, storage medium 144 stores one or more data sets, e.g., a plurality of data patterns, discussed below with respect to the noted processes and/or methods.

Figure 4:
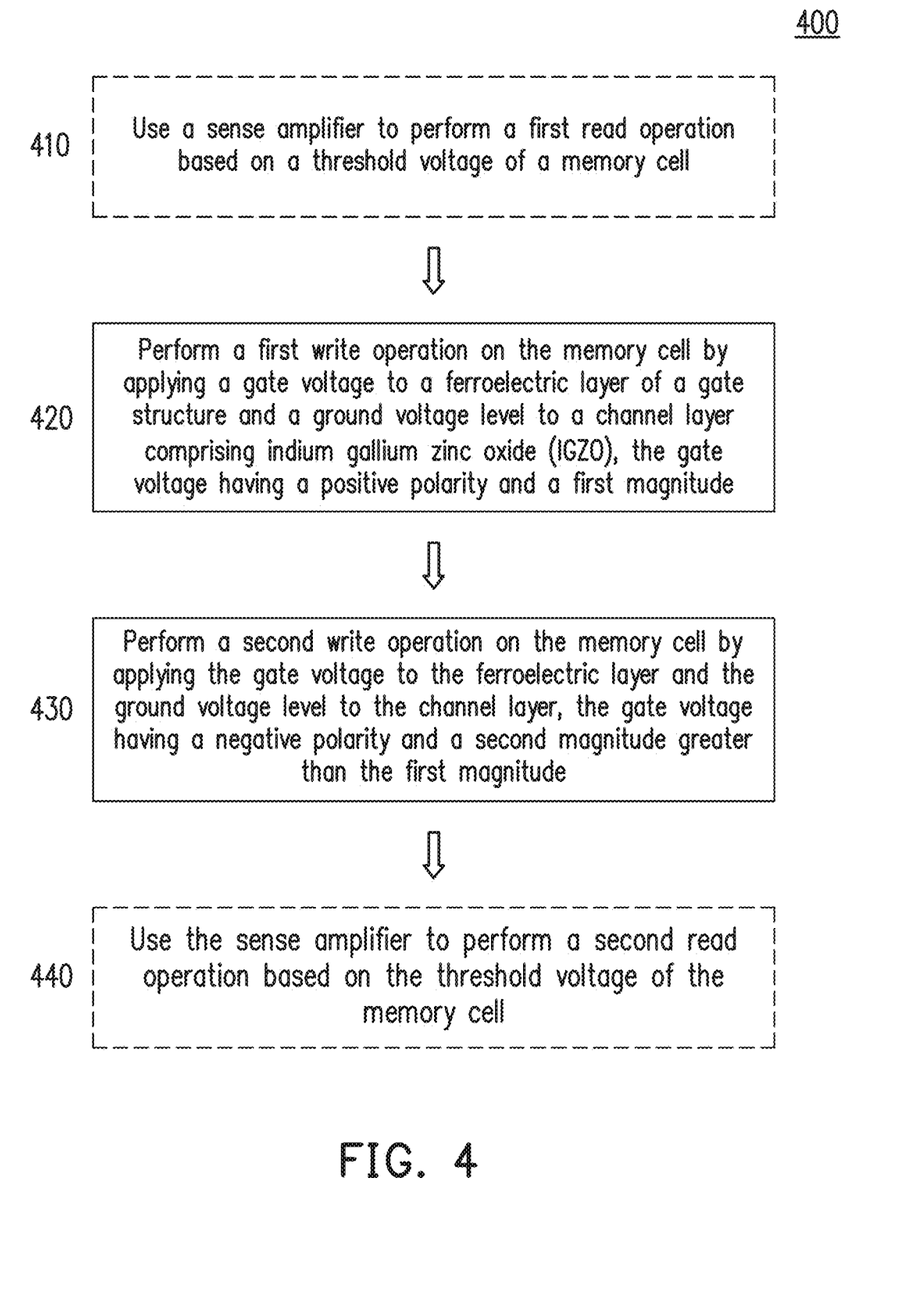
FIG. 4 is a flowchart of a method of writing data to a memory cell, in accordance with some embodiments.

FIG. 4 is a flowchart of method 400 of writing data to a memory cell, in accordance with some embodiments. Method 400 is usable with a memory circuit, e.g., memory circuit 100 including instances of memory cell 112 discussed above with respect to FIGS. 1A-3B.

The sequence in which the operations of method 400 are depicted in FIG. 4 is for illustration only; the operations of method 400 are capable of being executed in sequences that differ from that depicted in FIG. 4. In some embodiments, operations in addition to those depicted in FIG. 4 are performed before, between, during, and/or after the operations depicted in FIG. 4. In some embodiments, the operations of method 400 are a subset of a method of operating an IC, e.g., a processor, logic, memory, or signal processing circuit, or the like. In some embodiments, the operations of method 400 are a subset of a method of performing a memory array test.

In some embodiments, one or more of operations 410-440 is performed in part by a processor, e.g., processor 142 discussed above with respect to FIGS. 1A-3B.

At operation 410, in some embodiments, a sense amplifier is used to perform a first read operation based on a threshold voltage of a memory cell. In various embodiments, using the sense amplifier includes one or more of measuring or performing a comparison based on one or more voltages and/or one or more currents received from the memory cell. In some embodiments, using the sense amplifier to perform the first read operation includes using the one or more sense amplifiers 132 discussed above with respect to FIGS. 1A-3B. In some embodiments, performing the first read operation based on the threshold voltage of the memory cell includes performing the first read operation on memory cell 112 discussed above with respect to FIGS. 1A-3B.

Performing the first read operation based on a threshold voltage of the memory cell includes the threshold voltage having one of a first threshold voltage level programmed by executing some or all of operation 420 or a second threshold voltage level programmed by executing some or all of operation 430, each discussed below.

In some embodiments, performing the first read operation based on the threshold voltage of the memory cell includes the threshold voltage having one of two threshold voltage levels differing by more than 0.5 V, e.g., threshold voltage levels Vth1 and Vth2 discussed above with respect to memory circuit 100 and FIGS. 1A-3B.

At operation 420, a first write operation is performed on the memory cell by applying a gate voltage to a ferroelectric layer of a gate structure and a ground voltage level to a channel layer comprising a high electron mobility material, e.g., a metal oxide such as IGZO, the gate voltage having a positive polarity and a first magnitude.

In some embodiments, performing the first write operation on the memory cell includes performing the first write operation on memory cell 112 including ferroelectric layer 112FE and channel layer 112C discussed above with respect to FIGS. 1A-3B.

In some embodiments, the channel layer is positioned adjacent to the ferroelectric layer and between first and second S/D structures, and applying the ground voltage level to the channel layer includes applying the ground voltage level to each of the first and second S/D structures. In some embodiments, applying the ground voltage level to each of the first and second S/D structures includes applying the ground voltage level to each of source contact 112S and drain contact 112D discussed above with respect to FIGS. 1A-3B.

In some embodiments, performing the first write operation includes setting the threshold voltage of the memory cell. In some embodiments, setting the threshold voltage of the memory cell includes setting the threshold voltage of memory cell 112 to threshold voltage level Vth1 discussed above with respect to FIGS. 1A-3B.

In some embodiments, performing the first write operation includes shifting the threshold voltage of the memory cell by greater than 0.5 V, e.g., decreasing a threshold voltage level of the memory cell by greater than 0.5 V. In some embodiments, performing the first write operation includes shifting the threshold voltage of memory cell 112 from threshold voltage level Vth2 to threshold voltage level Vth1 discussed above with respect to FIGS. 1A-3B.

Applying the gate voltage to the ferroelectric layer in the first write operation includes applying the gate voltage having a first gate voltage duration. In some embodiments, the first gate voltage duration is a same duration as a second gate voltage duration discussed below with respect to operation 430. In some embodiments, applying the gate voltage having the first gate voltage duration includes applying word line voltage VWx from time t1 to time t2 discussed above with respect to FIGS. 2A and 2B.

In some embodiments, applying the gate voltage to the ferroelectric layer in the first write operation includes the first magnitude having a value less than 3 V, e.g., having the value ranging from 2 V to 2.5 V.

In some embodiments, applying the gate voltage to the ferroelectric layer in the first write operation includes applying word line voltage VWx having voltage level V1 including first magnitude M1, and applying each of voltages VBx and VSx having the ground voltage level of 0 V discussed above with respect to FIGS. 1A-3B.

In some embodiments, applying the gate voltage to the ferroelectric layer in the first write operation includes using a gate electrode including a conductive layer configured to increase a gate electrode work function by a target value less than 0.5 eV. In some embodiments, applying the gate voltage to the ferroelectric layer in the first write operation includes using gate electrode 112GE including conductive layer 112WF discussed above with respect to FIGS. 1A-3B.

In some embodiments, performing the first write operation is part of performing some or all of one of operations 410 or 440 discussed herein.

At operation 430, a second write operation is performed on the memory cell by applying the gate voltage to the ferroelectric layer and the ground voltage level to the channel layer, the gate voltage having a negative polarity and a second magnitude greater than the first magnitude. In some embodiments, applying the gate voltage to the ferroelectric layer includes the ferroelectric layer including PZT.

In some embodiments, performing the second write operation on the memory cell includes performing the second write operation on memory cell 112 including ferroelectric layer 112FE and channel layer 112C discussed above with respect to FIGS. 1A-3B.

In some embodiments, the channel layer is positioned adjacent to the ferroelectric layer and between first and second S/D structures, and applying the ground voltage level to the channel layer includes applying the ground voltage level to each of the first and second S/D structures. In some embodiments, applying the ground voltage level to each of the first and second S/D structures includes applying the ground voltage level to each of source contact 112S and drain contact 112D discussed above with respect to FIGS. 1A-3B.

In some embodiments, performing the second write operation includes setting the threshold voltage of the memory cell. In some embodiments, setting the threshold voltage of the memory cell includes setting the threshold voltage of memory cell 112 to threshold voltage level Vth2 discussed above with respect to FIGS. 1A-3B.

In some embodiments, performing the second write operation includes shifting the threshold voltage of the memory cell by greater than 0.5 V, e.g., increasing the threshold voltage level of the memory cell by greater than 0.5 V. In some embodiments, performing the second write operation includes shifting the threshold voltage of memory cell 112 from threshold voltage level Vth1 to threshold voltage level Vth2 discussed above with respect to FIGS. 1A-3B.

Applying the gate voltage to the ferroelectric layer in the second write operation includes applying the gate voltage having a second gate voltage duration. In some embodiments, the second gate voltage duration is the same duration as the first gate voltage duration discussed above with respect to operation 420. In some embodiments, applying the gate voltage having the second gate voltage duration includes applying word line voltage VWx from time t1 to time t2 discussed above with respect to FIGS. 2A and 2B.

In some embodiments, applying the gate voltage to the ferroelectric layer in the second write operation includes the second magnitude having a value greater than 3 V, e.g., having the value ranging from 3.5 V to 5 V. In some embodiments, applying the gate voltage to the ferroelectric layer in the second write operation includes the second magnitude having the value twice the value of the first magnitude of the gate voltage applied in the first write operation.

In some embodiments, applying the gate voltage to the ferroelectric layer in the second write operation includes applying word line voltage VWx having voltage level V2 including second magnitude M2, and applying each of voltages VBx and VSx having the ground voltage level of 0 V discussed above with respect to FIGS. 1A-3B.

In some embodiments, applying the gate voltage to the ferroelectric layer in the second write operation includes using the gate electrode including the conductive layer configured to increase the gate electrode work function by the target value less than 0.5 eV. In some embodiments, applying the gate voltage to the ferroelectric layer in the second write operation includes using gate electrode 112GE including conductive layer 112WF discussed above with respect to FIGS. 1A-3B.

In some embodiments, performing the second write operation is part of performing some or all of one of operations 410 or 440 discussed herein.

At operation 440, in some embodiments, the sense amplifier is used to perform a second read operation based on the threshold voltage of the memory cell. The second read operation is performed in the manner discussed above with respect to performing the first read operation in operation 410, and a detailed description thereof is not repeated.

By executing some or all of the operations of method 400, a FeRAM cell including a high electron mobility channel material such as IGZO is programmed using a first write operation in which a gate voltage has a positive polarity and a first magnitude, and a second write operation in which the gate voltage has a negative polarity and a second magnitude greater than the first magnitude, thereby realizing the benefits discussed above with respect to memory circuit 100 and memory cell 112.

In some embodiments, a memory circuit includes a memory array including a plurality of memory cells, each memory cell of the plurality of memory cells including an n-type channel layer including a metal oxide material, and a gate structure overlying and adjacent to the n-type channel layer, the gate structure including a conductive layer overlying a ferroelectric layer. The memory circuit is configured to apply a gate voltage to each memory cell of the plurality of memory cells in first and second write operations, the gate voltage has a positive polarity and a first magnitude in the first write operation, and the gate voltage has a negative polarity and a second magnitude greater than the first magnitude in the second write operation. In some embodiments, the memory circuit is configured to apply a ground voltage level to source and drain terminals of each memory cell of the plurality of memory cells in the first and second write operations. In some embodiments, the memory circuit is configured to apply the gate voltage having the positive polarity and the first magnitude for a first duration in the first write operation and having the negative polarity and the second magnitude for a second duration in the second write operation, and the first and second durations are a same duration. In some embodiments, the memory circuit is configured to apply the gate voltage having a ground voltage level to each memory cell of the plurality of memory cells before and after each of the first and second write operations. In some embodiments, the memory circuit is configured to apply the gate voltage having the first magnitude less than three volts and the second magnitude greater than three volts. In some embodiments, the memory circuit is configured to perform first and second read operations on each memory cell of the plurality of memory cells, the first and second read operations are based on respective first and second threshold voltage levels corresponding to the first and second write operations, and the first threshold voltage level is less than the second threshold voltage level by at least 0.5 volts. In some embodiments, the metal oxide material includes IGZO.

In some embodiments, a memory circuit includes a memory array including a plurality of memory cells, wherein each memory cell of the plurality of memory cells includes an n-type channel layer including a metal oxide material, and a gate structure overlying and adjacent to the n-type channel layer, wherein the gate structure includes a gate electrode overlying a ferroelectric layer and one or more n-type work function materials adjacent to the ferroelectric layer. The memory circuit is configured to apply a gate voltage to the gate electrode of each memory cell of the plurality of memory cells in first and second write operations, the gate voltage has a positive polarity and a first magnitude in the first write operation and a negative polarity and a second magnitude greater than the first magnitude in the second write operation. In some embodiments, the gate electrode includes the one or more n-type work function materials configured to adjust a work function by less than 0.5 eV. In some embodiments, the one or more n-type work function materials include one or more of Ti, Ag, TaAl, TaAlC, TiAlN, TaC, TaCN, TaSiN, Mn, or Zr. In some embodiments, each memory cell of the plurality of memory cells includes source and drain contacts adjacent to the n-type channel layer, and the memory circuit is configured to apply a ground voltage level to the source and drain contacts of each memory cell of the plurality of memory cells in the first and second write operations. In some embodiments, the metal oxide material includes IGZO. In some embodiments, each memory cell of the plurality of memory cells includes the ferroelectric layer including one or more of PZT, $HfO_2$, or HZO. In some embodiments, each memory cell of the plurality of memory cells is positioned in an interconnect structure of a semiconductor device.

In some embodiments, a method of writing data to a memory cell includes performing a first write operation on the memory cell by applying a gate voltage to a conductive layer of a gate structure including a ferroelectric layer between the conductive layer and an n-type channel layer including a metal oxide material, wherein the gate voltage has a positive polarity and a first magnitude, and performing a second write operation on the memory cell by applying the gate voltage to the conductive layer, wherein the gate voltage has a negative polarity and a second magnitude greater than the first magnitude. In some embodiments, applying the gate voltage to the conductive layer in the first write operation includes the first magnitude having a value less than 3 volts, and applying the gate voltage to the conductive layer in the second write operation includes the second magnitude having a value greater than 3 volts. In some embodiments, performing each of the first and second write operations includes applying a ground voltage level to source and drain contacts adjacent to the n-type channel layer. In some embodiments, performing each of the first and second write operations includes applying the gate voltage having a ground voltage level before and after the corresponding first or second write operation. In some embodiments, performing each of the first and second write operations includes using one or more n-type work function materials to increase a gate electrode work function by a value less than 0.5 electron-volts (eV). In some embodiments, performing each of the first and second write operations includes applying the gate voltage to the conductive layer of the gate structure positioned in an interconnect structure of a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a memory array comprising a plurality of memory cells, each memory cell of the plurality of memory cells comprising:
an n-type channel layer comprising a metal oxide material; and
a gate structure overlying and adjacent to the n-type channel layer, the gate structure comprising a conductive layer overlying a ferroelectric layer,
wherein
the memory circuit is configured to apply a gate voltage to each memory cell of the plurality of memory cells in first and second write operations,
the gate voltage has a positive polarity and a first magnitude in the first write operation, and
the gate voltage has a negative polarity and a second magnitude greater than the first magnitude in the second write operation.

2. The memory circuit of claim 1, wherein the memory circuit is configured to apply a ground voltage level to source and drain terminals of each memory cell of the plurality of memory cells in the first and second write operations.

3. The memory circuit of claim 1, wherein
the memory circuit is configured to apply the gate voltage having the positive polarity and the first magnitude for a first duration in the first write operation and having the negative polarity and the second magnitude for a second duration in the second write operation, and
the first and second durations are a same duration.

4. The memory circuit of claim 1, wherein the memory circuit is configured to apply the gate voltage having a ground voltage level to each memory cell of the plurality of memory cells before and after each of the first and second write operations.

5. The memory circuit of claim 1, wherein the memory circuit is configured to apply the gate voltage having the first magnitude less than three volts and the second magnitude greater than three volts.

6. The memory circuit of claim 1, wherein
the memory circuit is configured to perform first and second read operations on each memory cell of the plurality of memory cells,
the first and second read operations are based on respective first and second threshold voltage levels corresponding to the first and second write operations, and
the first threshold voltage level is less than the second threshold voltage level by at least 0.5 volts.

7. The memory circuit of claim 1, wherein the metal oxide material comprises indium gallium zinc oxide (IGZO).

8. A memory circuit comprising:
a memory array comprising a plurality of memory cells, wherein each memory cell of the plurality of memory cells comprises:
an n-type channel layer comprising a metal oxide material; and
a gate structure overlying and adjacent to the n-type channel layer, wherein the gate structure comprises a gate electrode overlying a ferroelectric layer and one or more n-type work function materials adjacent to the ferroelectric layer, wherein
the memory circuit is configured to apply a gate voltage to the gate electrode of each memory cell of the plurality of memory cells in first and second write operations,
the gate voltage has a positive polarity and a first magnitude in the first write operation, and
the gate voltage has a negative polarity and a second magnitude greater than the first magnitude in the second write operation.

9. The memory circuit of claim 8, wherein the gate electrode comprises the one or more n-type work function materials configured to adjust a work function by less than 0.5 electron-volts (eV).

10. The memory circuit of claim 8, wherein the one or more n-type work function materials comprise one or more of Ti, Ag, TaAl, TaAlC, TiAlN, TaC, TaCN, TaSiN, Mn, or Zr.

11. The memory circuit of claim 8, wherein
each memory cell of the plurality of memory cells comprises source and drain contacts adjacent to the n-type channel layer, and
the memory circuit is configured to apply a ground voltage level to the source and drain contacts of each memory cell of the plurality of memory cells in the first and second write operations.

12. The memory circuit of claim 8, wherein the metal oxide material comprises indium gallium zinc oxide (IGZO).

13. The memory circuit of claim 8, wherein each memory cell of the plurality of memory cells comprises the ferroelectric layer comprising one or more of lead zirconate titanate (PZT), hafnium oxide ($HfO_2$), or hafnium zirconium oxide (HZO).

14. The memory circuit of claim 8, wherein each memory cell of the plurality of memory cells is positioned in an interconnect structure of a semiconductor device.

15. A method of writing data to a memory cell, the method comprising:
performing a first write operation on the memory cell by applying a gate voltage to a conductive layer of a gate structure comprising a ferroelectric layer between the conductive layer and an n-type channel layer comprising a metal oxide material, wherein the gate voltage has a positive polarity and a first magnitude; and
performing a second write operation on the memory cell by applying the gate voltage to the conductive layer, wherein the gate voltage has a negative polarity and a second magnitude greater than the first magnitude.

16. The method of claim 15, wherein
the applying the gate voltage to the conductive layer in the first write operation comprises the first magnitude having a value less than 3 volts, and
the applying the gate voltage to the conductive layer in the second write operation comprises the second magnitude having a value greater than 3 volts.

17. The method of claim 15, wherein the performing each of the first and second write operations comprises applying a ground voltage level to source and drain contacts adjacent to the n-type channel layer.

18. The method of claim 15, wherein the performing each of the first and second write operations comprises applying the gate voltage having a ground voltage level before and after the corresponding first or second write operation.

19. The method of claim 15, wherein the performing each of the first and second write operations comprises using one or more n-type work function materials to increase a gate electrode work function by a value less than 0.5 electron-volts (eV).

20. The method of claim 15, wherein the performing each of the first and second write operations comprises applying the gate voltage to the conductive layer of the gate structure positioned in an interconnect structure of a semiconductor device.

* * * * *